(12) United States Patent
Yao

(10) Patent No.: US 8,888,949 B2
(45) Date of Patent: Nov. 18, 2014

(54) PLASMA PROCESSING EQUIPMENT AND GAS DISTRIBUTION APPARATUS THEREOF

(75) Inventor: Liqiang Yao, Beijing (CN)

(73) Assignee: Beijing NMC Co., Ltd., Beijing (CN)

( * ) Notice: Subject to any disclaimer, the term of this patent is extended or adjusted under 35 U.S.C. 154(b) by 994 days.

(21) Appl. No.: 12/811,991

(22) PCT Filed: Jan. 9, 2009

(86) PCT No.: PCT/CN2009/070091
§ 371 (c)(1),
(2), (4) Date: Jul. 7, 2010

(87) PCT Pub. No.: WO2009/089794
PCT Pub. Date: Jul. 23, 2009

(65) Prior Publication Data
US 2010/0276084 A1 Nov. 4, 2010

(30) Foreign Application Priority Data
Jan. 14, 2008 (CN) .............................. 200810056179

(51) Int. Cl.
*H01L 21/3065* (2006.01)
*H01L 21/3205* (2006.01)
(Continued)

(52) U.S. Cl.
CPC ..... *C23C 16/45565* (2013.01); *H01L 21/67069* (2013.01); *H01J 37/3244* (2013.01)
USPC ................... 156/345.34; 156/345.33; 118/715

(58) Field of Classification Search
CPC .............. C23C 16/4412; C23C 16/448; C23C 16/4481; C23C 16/4482; C23C 16/4485; C23C 16/455; C23C 16/4488; C23C 16/45502; C23C 16/4551; C23C 16/45512; C23C 16/45519; C23C 16/45521; C23C 16/45514; C23C 16/45553; C23C 16/45527; C23C 16/45534; C23C 16/45536; C23C 16/45542; C23C 16/45538; C23C 16/4554; C23C 16/45544; C23C 16/45551; C23C 16/45555; C23C 16/45563; C23C 16/45565; C23C 16/45568; C23C 16/4557; C23C 16/45572; C23C 16/4558
USPC .......................... 118/715; 156/345.33, 345.34
See application file for complete search history.

(56) References Cited

U.S. PATENT DOCUMENTS 4,780,169 A * 10/1988 Stark et al. ............... 156/345.34
6,245,192 B1 * 6/2001 Dhindsa et al. .......... 156/345.34
(Continued)

FOREIGN PATENT DOCUMENTS

CN 1367933 A 9/2002
CN 1538507 A 10/2004
(Continued)

OTHER PUBLICATIONS

International Search Report, PCT/CN2009/070091 dated Apr. 23, 2009.
(Continued)

*Primary Examiner* — Parviz Hassanzadeh
*Assistant Examiner* — Satish Chandra
(74) *Attorney, Agent, or Firm* — Edwards Wildman Palmer LLP; Howard M. Gitten

(57) ABSTRACT

A gas distribution apparatus for a plasma processing equipment is provided. The gas distribution apparatus includes a support plate (3) and a showerhead electrode (5) that are secured together parallelly to define a chamber for gas distribution. A first gas distribution plate (4) is arranged in the chamber horizontally. On an upper surface of the gas distribution plate (4), at least one circumferential gas-flow groove (41) around its axis and a plurality of radial gas-flow grooves (42) communicating with the at least one circumferential gas-flow groove (41) is arranged. A plurality of axial viahole (43) are formed in the at least one circumferential gas-flow groove (41) and the plurality of radial gas-flow grooves (42). The gas distribution apparatus can achieve a uniform gas distribution in the plasma processing equipment.

14 Claims, 6 Drawing Sheets

(51) Int. Cl.
*H01L 21/36* (2006.01)
*H01L 21/365* (2006.01)
*C23C 16/44* (2006.01)
*C23C 16/452* (2006.01)
*C23C 16/455* (2006.01)
*H01J 37/32* (2006.01)
*H01L 21/67* (2006.01)

(56) References Cited

U.S. PATENT DOCUMENTS

| | | | |
|---|---|---|---|
| 6,415,736 B1 * | 7/2002 | Hao et al. | 118/723 E |
| 2001/0025605 A1 * | 10/2001 | Nagakura | 118/715 |
| 2002/0129902 A1 * | 9/2002 | Babayan et al. | 156/345.45 |
| 2004/0134611 A1 * | 7/2004 | Kato et al. | 156/345.33 |
| 2005/0077010 A1 | 4/2005 | Goto | |
| 2005/0133160 A1 * | 6/2005 | Kennedy et al. | 156/345.34 |
| 2006/0021701 A1 | 2/2006 | Tobe et al. | |
| 2008/0141941 A1 * | 6/2008 | Augustino et al. | 118/723 R |
| 2008/0178805 A1 | 7/2008 | Paterson et al. | |
| 2008/0242085 A1 * | 10/2008 | Fischer et al. | 438/680 |
| 2009/0179085 A1 * | 7/2009 | Carducci et al. | 239/289 |

FOREIGN PATENT DOCUMENTS

| | | |
|---|---|---|
| CN | 1795530 A | 6/2006 |
| JP | 06-349761 | * 12/1994 |
| WO | WO 2009/089794 A1 | 7/2009 |

OTHER PUBLICATIONS

English language abstracts: WO 2009/089794 A1; CN1367933A; CN1795530A; and CN1538507A, pub date for WO 2009/089794 is Jul. 23, 2009; pub date for CN 1367933 is Sep. 4, 2002; pub date for CN 1795530 is Jun. 28, 2006; pub date for CN 1538507 is Oct. 20, 2004.

* cited by examiner

PLASMA PROCESSING EQUIPMENT AND GAS DISTRIBUTION APPARATUS THEREOF

CROSS REFERENCES TO RELATED APPLICATIONS

This application is a U.S. national phase application pursuant to 35 U.S.C. §371, of PCT/CN2009/070091 filed Jan. 9, 2009, which claims priority to Chinese Patent Application No. 200810056179.7 filed Jan. 14, 2008. The entire contents of the aforementioned patent applications are incorporated herein by these references.

FIELD OF THE INVENTION

The invention relates to the field of microelectronics technologies, especially to a gas distribution apparatus used in a plasma processing equipment. The invention also relates to a plasma processing equipment comprising said gas distribution apparatus.

BACKGROUND OF THE INVENTION

The plasma processing equipment is widely used in the field of microelectronics technologies.

Reference could be made to FIG. 1 which is a structural schematic diagram of a usual plasma processing equipment.

Plasma processing equipment 1 usually comprises a housing 11, in which a reaction chamber 12 with a top electrode plate 13 and a bottom electrode plate 14 arranged face to face respectively on the top and the bottom of the reaction chamber 12 is formed. The top electrode plate 13 is separated from the housing 11 by an insulating member 15; and a workpiece to be processed can be held on the surface of the bottom electrode plate 14. Said workpiece should include wafer and other workpieces having the same processing principle as the wafer. The term "workpiece" used in the following will have the same meaning.

In the operation of the plasma processing equipment 1, a vacuum producing apparatus (not shown in the Figure) such as a dry pump produces and keeps a status approximate to vacuum. In such status, the process gas is delivered into the reaction chamber 12 by a gas distribution apparatus 16, and an appropriate RF power is applied across the top electrode plate 13 and the bottom electrode plate 14 to activate said process gas, so that a plasma environment is produced and kept on the surface of the workpiece. Due to the strong etching and deposition capabilities, the plasma can make physical and chemical reactions such as etching and deposition with the workpiece, such that the required etching pattern or deposition layer is obtained. The by-product of the physical and chemical reactions is pump out from the reaction chamber 12 by the vacuum producing apparatus.

As is known to all, the degree of uniformity of distribution of the process gas on the surface of the workpiece is of key importance to the quality of workpiece. With increase of the overall size of the workpiece such as a wafer, the area of the cross section of the reaction chamber 12 becomes larger and larger, and it is more and more difficult to achieve a uniform distribution of the process gas.

The degree of uniformity of distribution of the process gas relates to various factors, wherein, to a great extent, the structure of the gas distribution apparatus determines the uniformity of distribution of the process gas in the reaction chamber.

Reference could be made to FIG. 2 which is a structural schematic diagram of a usual gas distribution apparatus.

The usual gas distribution apparatus 2 comprises a support plate 21 with a substantially round shape, which is located at the central position of the top of the plasma processing equipment and is fixedly connected to a top electrode plate in a conventional manner, and an air inlet 211 is arranged in the center of the support plate 21.

A showerhead electrode 23 with a substantially round shape and coaxial with the support plate 21 is fixedly connected below the support plate 21, and the connecting portion between the support plate 21 and the showerhead electrode 23 is gas sealing (the term "gas sealing" used here and the term "gas sealing" used in the following means a consequence rather than a means; that's to say, no matter what a concrete technical means is used, a phenomenon of gas leakage should not appear in the connecting portion between the support plate 21 and the showerhead electrode 23), a gas distribution chamber is formed between the support plate 21 and the showerhead electrode 23. The air inlet 211 communicates with the gas distribution chamber.

Multiple layers of flow choking plates 22 are arranged in the gas distribution chamber in a conventional manner, and a suitable distance is kept between respective layer of the flow choking plate 22, as well as between the flow choking plate 22 and the support plate 21, and between the flow choking plate 22 and the showerhead electrode 23, thus, the gas distribution chamber is divided into several small chambers from top to bottom. The flow choking plate 22 comprises a plurality of gas passages 211 each of which penetrates through the flow choking plate 22 in its axial direction, so that one small chamber can communicate with another.

Because the gas passages 211 in respective layers of the flow choking plate 22 are staggered, the process gas is forced to be subjected to a certain lateral displacement, and thus the radial uniformity is improved; as the number of the layers of the flow choking plate 22 increases, times that the process gas is subjected to a lateral displacement increases, thus the radial uniformity of the process gas obtained on the upper surface 232 of the showerhead electrode 23 is accordingly improved.

A plurality of gas holes 231, which are used to make the lowest small chamber of the gas distribution chamber communicate with the reaction chamber below the showerhead electrode 23, are uniformly distributed in the showerhead electrode 23. The comparatively uniform process gas on the upper surface 232 of the showerhead electrode 23 can flow into the reaction chamber of the plasma processing equipment through the gas holes 231.

However, as mentioned above, the gas distribution apparatus forces the process gas to be subjected to a lateral displacement by means of a hindrance function of the flow choking plate 22, so that the radial uniformity of the process gas is improved; thus, in order to obtain a improved lateral uniformity, many layers of flow choking plates 22 are required. As a result, the gas distribution apparatus mentioned above is structurally complex and huge in volume, and the manufacturing cost is also high; while a reduction of the number of the flow choking plates 22 will reduce the uniformity of process gas distribution.

Therefore, the gas distribution apparatus in the art either is too complex and has high manufacturing cost, or can't obtain high uniformity of process gas distribution. Skilled in the art has an urgent technical problem to solve, that is, how to simplify the structure of the gas distribution apparatus while making sure that the uniformity of process gas distribution is not reduced.

SUMMARY

An object of the invention is to provide a gas distribution apparatus, which has a simpler structure and can provide process gas with higher uniformity. Another object of the invention is to provide a plasma processing equipment comprising said gas distribution apparatus.

In order to solve the above technical problems, the invention provides a gas distribution apparatus used for a plasma processing equipment, comprising a support plate which is fixedly connected to an top electrode and arranged horizontally, a first air inlet passage is provided at a central position of the support plate; a showerhead electrode, which is parallel to the support plate, is fixedly connected below the support plate, a first gas distribution plate is horizontally arranged in a chamber between the support plate and the showerhead electrode, and the first gas distribution plate has a plurality of axial viahole; a central position of the first gas distribution plate is corresponding to the central position of the support plate; at least one circumferential gas-flow groove surrounding the central position of the first gas distribution plate and a plurality of radial gas-flow grooves communicating with the at least one circumferential gas-flow groove are arranged on an upper surface of the gas distribution plate; the plurality of axial viahole are arranged in the circumferential gas-flow groove and the plurality of radial gas-flow grooves.

Preferably, the radial gas-flow grooves are uniformly distributed, and widths of the radial gas-flow grooves are gradually reduced outwards along a radial direction of the first gas distribution plate.

Preferably, minimal cross-section areas of the axial viahole in one and the same circumferential gas-flow groove are the same; the minimal cross-section areas of the axial viahole in one and the same radial gas-flow grooves gradually increase outwards along the radial direction of the first gas distribution plate.

Preferably, a density of the axial viahole in one and the same radial gas-flow grooves gradually increases outwards along the radial direction of the first gas distribution plate.

Preferably, the first gas distribution plate comprises a plurality of circumferential gas-flow grooves, and the widths of the circumferential gas-flow grooves successively increase outwards along the radial direction of the first gas distribution plate.

Preferably, the support plate further comprises a second air inlet passage which is deviated from the central position of the support plate, a distance between the second air inlet passage and the first air inlet passage is larger than a radius of the first gas distribution plate; and a second gas distribution plate is further included in the chamber between the support plate and the showerhead electrode, and the second gas distribution plate closely surrounds the first gas distribution plate, and a chamber space on top of the first gas distribution plate and a chamber space on top of the second gas distribution plate are separated from each other by a sealing ring; the second gas distribution plate includes at least one circumferential gas-flow groove and a plurality of radial gas-flow grooves communicating with the at least one circumferential gas-flow groove; a plurality of axial viahole are arranged in the at least one circumferential gas-flow groove and the plurality of radial gas-flow grooves.

Preferably, the second air inlet passage is corresponding to one circumferential gas-flow groove of the second gas distribution plate.

Preferably, a width of said one circumferential gas-flow groove which is corresponding to the second air inlet passage gradually reduces in a direction of gas flow.

Preferably, widths of the plurality of radial gas-flow grooves in the second gas distribution plate gradually increase outwards along a radial direction of the second gas distribution plate.

Preferably, minimal cross-section areas of respective axial viahole located in one and the same circumferential gas-flow groove in the second gas distribution plate successively increase outwards along the radial direction of the second gas distribution plate.

Preferably, density of respective axial viahole located in one and the same circumferential gas-flow groove in the second gas distribution plate successively increase outwards along the radial direction of the second gas distribution plate.

Preferably, the second gas distribution plate comprises a plurality of circumferential gas-flow grooves, and widths of the circumferential gas-flow grooves successively increase outwards along the radial direction of the second gas distribution plate.

The invention also provides a plasma processing equipment, and the plasma processing equipment includes the gas distribution apparatus as described above.

Preferably, the plasma processing equipment is a plasma etching equipment.

Comparing with the above described background art, the present invention provides a gas distribution apparatus, wherein on the upper surface of the first gas distribution plate, the circumferential gas-flow groove surrounding the central position of the first gas distribution plate and the plurality of radial gas-flow grooves communicating with the circumferential gas-flow groove are arranged; the process gas entering from the first air inlet passage can rapidly spread laterally along said plurality of radial gas-flow grooves, so as to realize a uniform distribution of the process gas in the radial direction; then, the process gas enters into said circumferential gas-flow groove from said radial gas-flow grooves, so as to realize the uniform distribution of the process gas in the circumferential direction. Therefore, just by means of a simple structure, the gas distribution apparatus provided by the invention guarantees the highly uniform distribution of the process gas in the reaction chamber, and overcomes defects that the gas distribution apparatus in the prior art is too complex in structure and has a high manufacturing cost; thus, the structure of the plasma processing equipment provided by the invention is also simplified, and the cost is also reduced.

DETAILED DESCRIPTION OF THE PREFERRED EMBODIMENT

The key concept of the invention is to provide a gas distribution apparatus, which has a simple structure and can provide process gas with high uniformity. Another key concept of the invention is to provide a plasma processing equipment comprising said gas distribution apparatus.

In order that the persons skilled in the art could understand the technical solution of the invention better, further detailed description is made to the invention in connection with the figures and specific embodiments.

Figure 1:
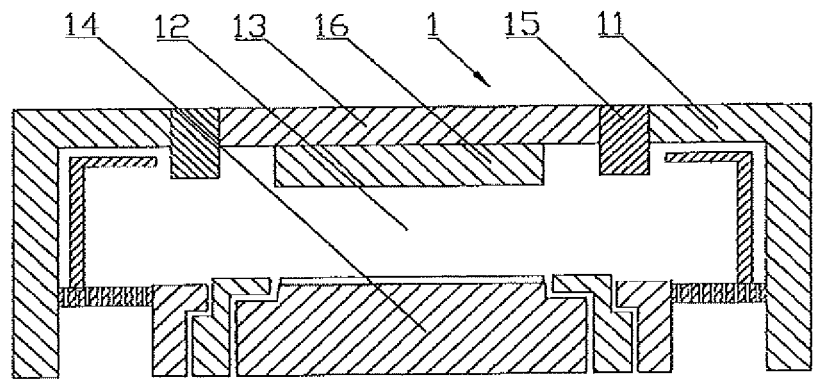
FIG. 1 is a structural schematic diagram of a usual plasma processing equipment.
Figure 2:
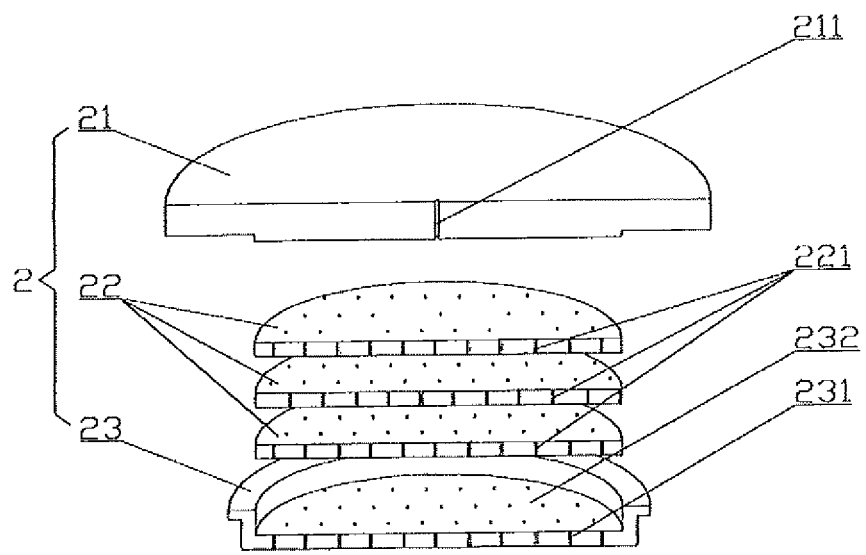
FIG. 2 is a structural schematic diagram of a gas distribution apparatus in the plasma processing equipment of FIG. 1.
Figure 3:
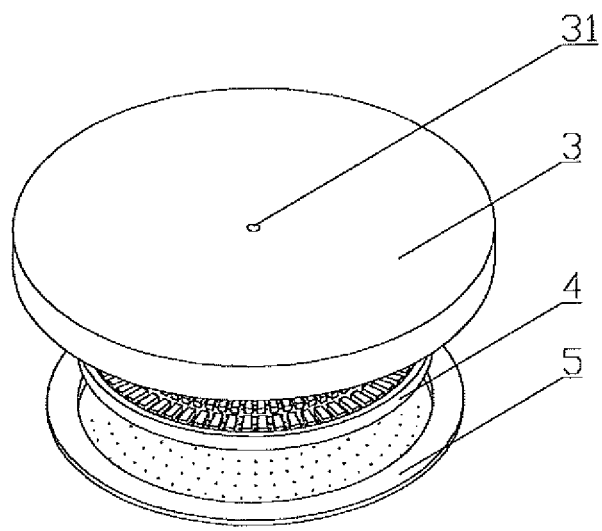
FIG. 3 is a structural schematic diagram of a gas distribution apparatus according to a first embodiment of the invention.

Reference could be made to FIG. 3 which is a structural schematic diagram of the gas distribution apparatus according to a first embodiment of the invention.

In the first embodiment, the gas distribution apparatus provided by the invention includes a support plate 3, and the support plate 3 is commonly arranged horizontally at a central position of the top of a chamber reaction of the plasma processing equipment, and is fixedly connected to a top electrode plate of the plasma processing equipment in a conventional manner. A first air inlet passage 31 is arranged at a substantially center position of the support plate 3.

A showerhead electrode 5, which is also substantially horizontally arranged, is fixedly connected to the lower part of the support plate 3, thus a gas distribution chamber is formed between the support plate 3 and the showerhead electrode 5. A first gas distribution plate 4 is arranged in the gas distribution chamber in a conventional manner, and the first gas distribution plate 4 is parallel to the support plate 3 and the showerhead electrode 5, and the first gas distribution plate 4 keeps an appropriate distance from each of the support plate 3 and the showerhead electrode 5 respectively, so that two chambers with suitable thicknesses are formed respectively above and under the first gas distribution plate 4.

The first gas distribution plate 4 includes a plurality of axial viahole 43 (referring to FIG. 4) which penetrate through the first gas distribution plate 4, so that the chamber space above the first gas distribution plate 4 could communicate or connect with the chamber under the first gas distribution plate 4; the showerhead electrode 5 includes several gas holes (no reference numbers are added to them in the figures), so that the chamber under the first gas distribution plate 4 could communicate with the reaction chamber of the plasma processing equipment.

Figure 4:
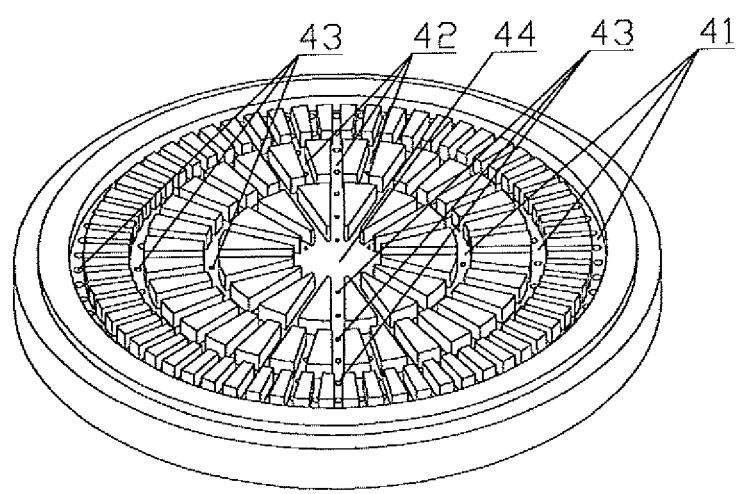
FIG. 4 is an isometric schematic diagram of a specific embodiment of the first gas distribution plate in FIG. 3.
Figure 5:
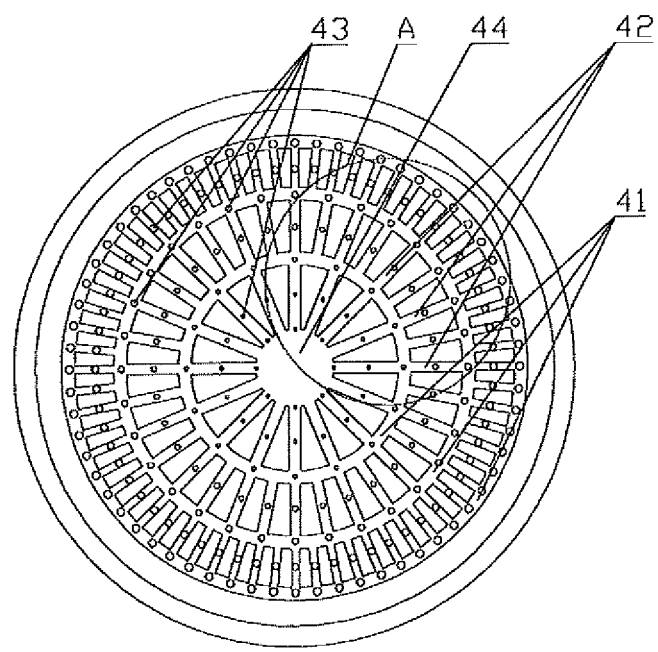
FIG. 5 is a top view of the first gas distribution plate shown in FIG. 4.
Figure 6:
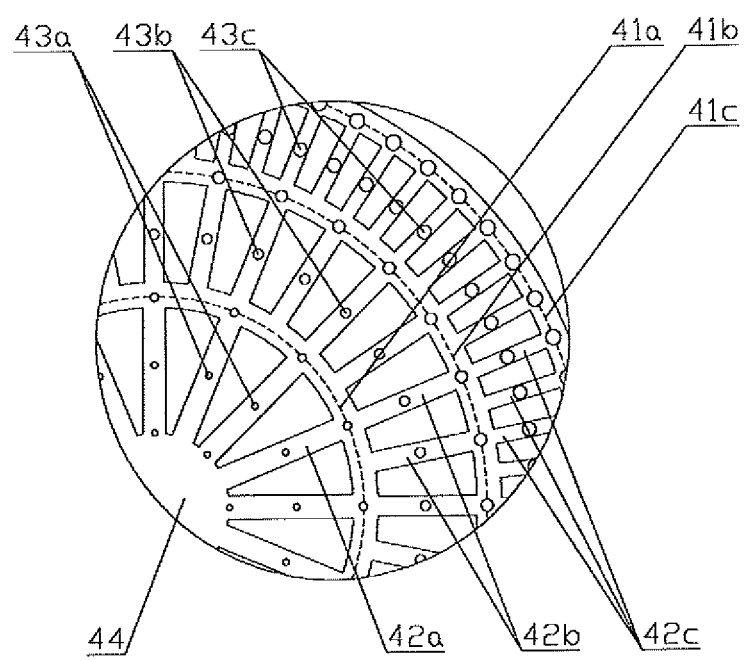
FIG. 6 is a partial enlarged drawing of a section A in FIG. 5.

References could be made to FIG. 4 which is an isometric schematic diagram of a specific embodiment of the first gas distribution plate in FIG. 3, FIG. 5 which is a top view of the first gas distribution plate shown in FIG. 4, and FIG. 6 which is a partial enlarged drawing of a section A in FIG. 5.

In the first embodiment, the first gas distribution plate 4 provided by the invention is substantially round shaped; obviously, the first gas distribution plate 4 could also be of other shapes such as regular polygon. The central position of the first gas distribution plate 4 is preferably corresponding to the first air inlet passage 31 of the support plate 3, so that the process air entering through the first air inlet passage 31 can first arrive at the central position of the first gas distribution plate 4.

A surface of the first gas distribution plate 4 facing the support plate 3 is provided with at least one circumferential gas-flow groove 41 surrounding the central position of the first gas distribution plate 4; specifically, a shape of the circumferential gas-flow groove 41 may be round, and when there are two or more circumferential gas-flow grooves 41, all the circumferential gas-flow grooves 41 are preferably arranged concentrically. In the present embodiment, the first gas distribution plate 4 includes three circumferential gas-flow grooves 41, which are a first circumferential gas-flow groove 41a, a second circumferential gas-flow groove 41b and a third circumferential gas-flow groove 41c.

The surface of the first gas distribution plate 4 facing the support plate 3 is further provided with a plurality of radial gas-flow grooves 42, each of which is divided by the circumferential gas-flow grooves 41 into an inner segment 42a, a middle segment 42b and an outer segment 42c; as illustrated in FIG. 6, the number of the inner segments 42a, the number of the middle segments 42b and the number of the outer segments 42c are successively increased, such that the radial gas-flow grooves could be uniformly distributed on the whole first gas distribution plate 4. Preferably, respective radial gas-flow grooves 42 are also uniformly distributed in the circumferential direction, i.e. an angle between two adjacent inner segments 42a is substantially the same, an angle between two adjacent middle segments 42b is substantially the same and an angle between two adjacent outer segments 42c is substantially the same.

Furthermore, preferably, depths of all the radial gas-flow grooves 42 and the circumferential gas-flow grooves 41 are the same; a shape of the cross section of each of the radial gas-flow grooves 42 and the circumferential gas-flow grooves 41 may be square, trapezoid, round, ellipsoid and so on, and in order to make the manufacturing convenient to process, it is better to set it as a square shape.

All the radial gas-flow grooves 42 converge at the central position of the first gas distribution plate 4, thus a central groove 44 is formed at this central position; the central groove 44 corresponds to the first air inlet passage 31 of the support plate 3.

Axial viahole 43, which penetrate through the first gas distribution plate 4, are distributed in the above-mentioned circumferential gas-flow grooves 41 and radial gas-flow groove 42. A shape of the cross section of the axial viahole 43 may be round, square, triangular and so on, and the axial viahole 43 may be a straight hole, a stepped hole, or an inclined hole; it is preferable to set it as a straight hole with a round-shaped cross section so as to facilitate the manufacturing.

Because the circumferential gas-flow grooves 41 and the radial gas-flow grooves 42 communicating with each other are provided on the upper surface of the first gas distribution plate 4, the process gas flowing from the first air inlet passages 31 of the support plate 3 into the central groove 44 can spread rapidly along the radial gas-flow grooves 42, thus the uniform distribution of the process gas in the radial direction of the first gas distribution plate 4 is achieved; then, the process gas enters into each of the circumferential gas-flow grooves 41 from each of the radial gas-flow grooves 42, thus the uniform distribution of the process gas in the circumferential direction of the first gas distribution plate 4 is achieved. Therefore, the gas distribution apparatus provided by the invention ensures that the process gas will possess higher uniformity in the reaction chamber only by means of a simply structure, thus the above-mentioned defect that the gas distribution apparatus in the prior art is complex in structure and has a higher manufacturing cost is overcame.

Some modifications can be made to the first gas distribution plate of the first specific embodiment.

First of all, the width of the radial gas-flow groove 42 may be set to gradually reduce from the central position of the first gas distribution plate 4 to a peripheral portion of the first gas distribution plate 4. As illustrated in FIG. 6, the widths of the inner segment 42a, the middle segment 42b and the outer segment 42c of the radial gas-flow groove 42 successively reduce, and the width of each segment itself also gradually reduces outwards.

Space of the reaction chamber below the peripheral portion of the first gas distribution plate 4 is big, thus more process gas is required. The width of the radial gas-flow groove 42 is set to gradually reduce outwards as described above, which helps the process gas to flow at a high speed from the central groove 44 to the first gas distribution plate 4 along the radial gas-flow grooves 42, thus it is guaranteed that the reaction chamber below the peripheral portion can obtain enough process gas, so that the peripheral portion is free from lacking of gas.

Secondly, a minimal cross-section area of the axial viahole 43 (i.e. its gas passing ability) can be adjusted such that the minimal cross-section areas of the axial viahole 43 in the inner segment 42a, the middle segment 42b and the outer segment 42c of the radial gas-flow groove 42 increase successively; that's to say, the minimal cross-section area of an axial viahole 43a, the minimal cross-section area of an axial viahole 43b and the minimal cross-section area of an axial viahole 43c increase successively.

As described above, the process gas is in hard demand in the reaction chamber below the peripheral portion of the first gas distribution plate 4, thus, if the minimal cross-section area of the axial viahole 43 of said peripheral portion is properly increased, the gas passing ability is enhanced, thus a gas supply will be increased, then the peripheral portion of the reaction chamber is further free from lacking of gas.

Thirdly, a density of the axial viahole 43 can be adjusted such that the density of the axial viahole 43 at the peripheral portion of the first gas distribution plate 4 is bigger; that is, a distance between the axial viahole 43a and the axial viahole 43b is larger than that between the axial viahole 43c and the axial viahole 43d. A purpose for such arrangement is also to increase the gas supply at the peripheral portion of the reaction chamber, and in turn to avoid lacking of gas.

Last, the widths of the circumferential gas-flow grooves 41 can be adjusted such that the width of a circumferential gas-flow groove at a lane is slightly larger than the width of a circumferential gas-flow groove at its adjacent inner lane; that's to say, the first circumferential gas-flow groove 41a, the second circumferential gas-flow groove 41b, and the third circumferential gas-flow groove 41c successively increase in width. As the width increases, the ability of the process gas to pass each of the circumferential gas-flow grooves are successively enhanced, thus the gas supply at the peripheral portion of the reaction chamber is further guaranteed.

Figure 7:
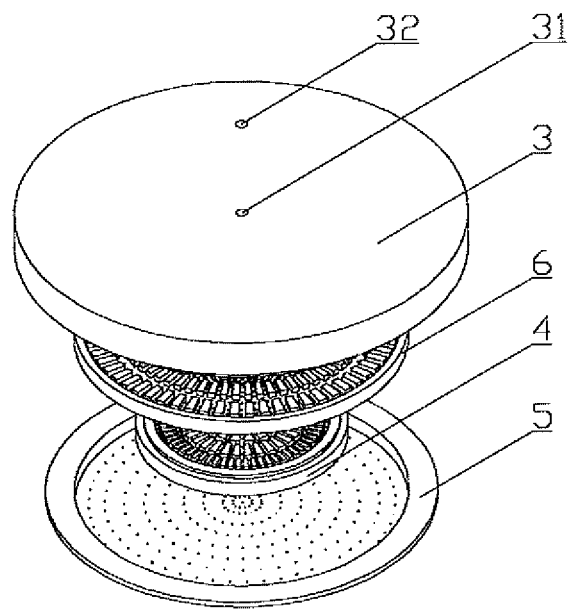
FIG. 7 is a structural schematic diagram of the gas distribution apparatus according to a second embodiment of the invention.

Reference could be made to FIG. 7 which is a structural schematic diagram of the gas distribution apparatus according to another specific embodiment of the invention.

In the second embodiment, the gas distribution apparatus provided by the invention is modified on the basis of the above described first embodiment.

The support plate 3 is further provided with a second air inlet passage 32 deviating from the first air inlet passage 31. Meanwhile, the radius of the first gas distribution plate 4 is reduced to a value smaller than a distance between the first air inlet passage 31 and the second air inlet passage 32.

A second gas distribution plate 6 is further provided, wherein an inner diameter of the second gas distribution plate 6 is equal to an outer diameter of the first gas distribution plate 4, and the second gas distribution plate 6 horizontally surrounds the first gas distribution plate 4 at its outer edge; both the gas distribution plates as a whole locate between the support plate 3 and the showerhead electrode 5. A sealing ring (not shown in the figure) is provided in a chamber space between the support plate 3 and the two gas distribution plates 4, 6, and the sealing ring divides the chamber space into a center part and a ring-shaped peripheral part isolating from each other, bottoms of the center part and the ring-shaped peripheral part are respectively the first gas distribution plate 4 and the second gas distribution plate 6. Said first air inlet passage 31 communicates with the center part; and the second air inlet passage 32 communicates with the ring-shaped peripheral part.

Figure 8:
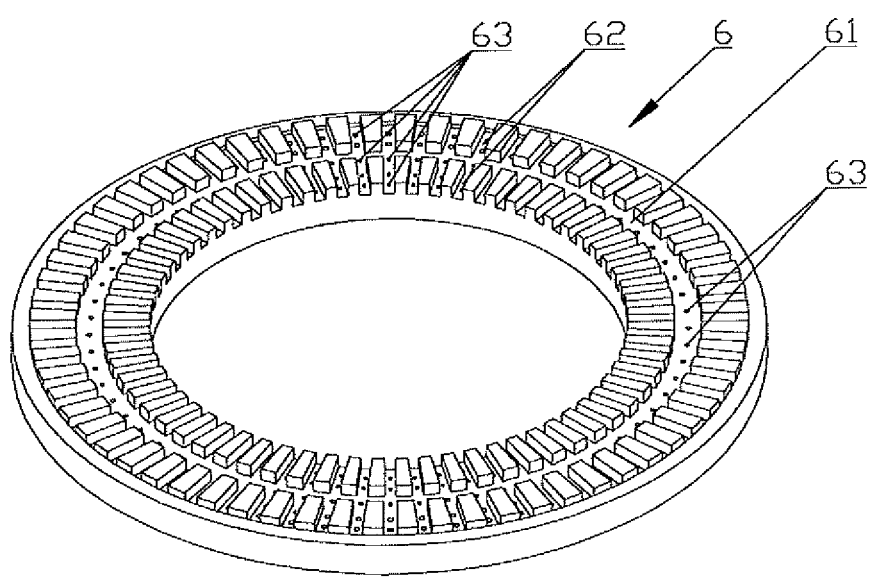
FIG. 8 is an isometric schematic diagram of a first specific embodiment of a second gas distribution plate in FIG. 7.
Figure 9:
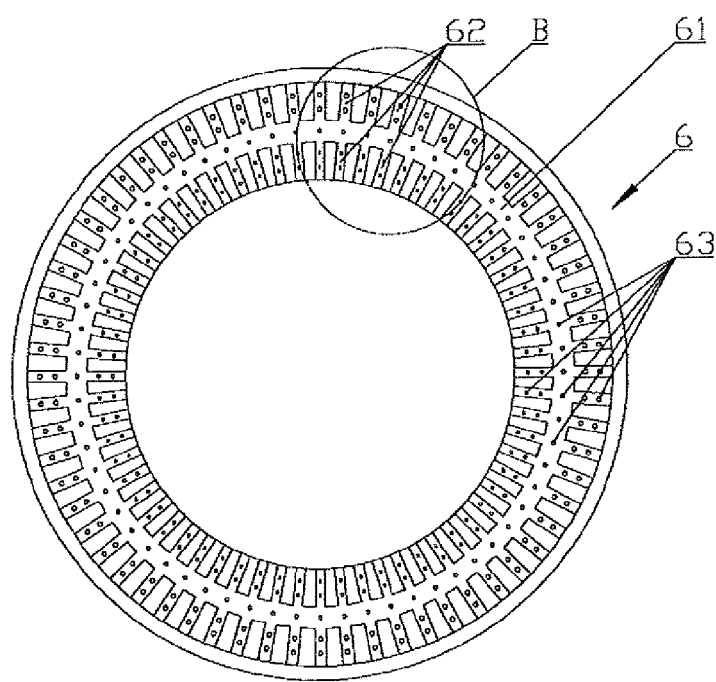
FIG. 9 is a top view of the second gas distribution plate shown in FIG. 8.
Figure 10:
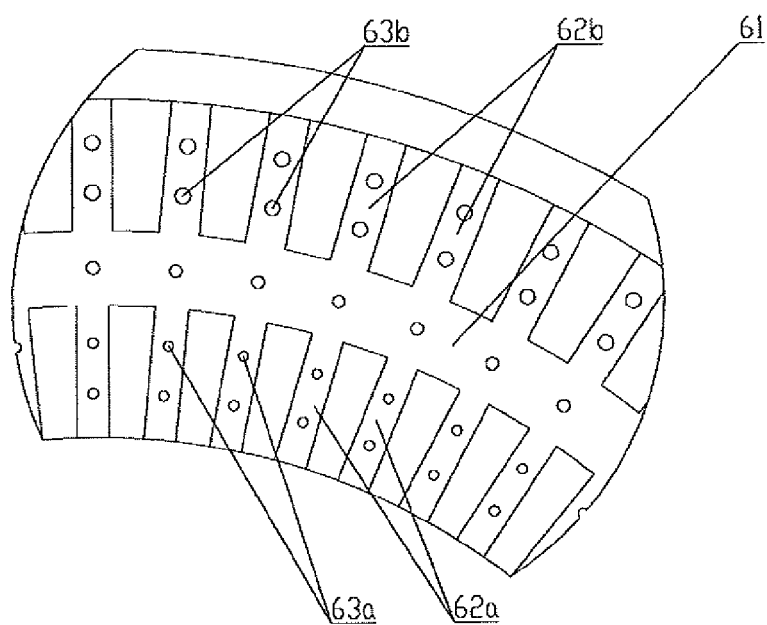
FIG. 10 is a partial enlarged drawing of a section B in FIG. 9.

References could be made to FIG. 8 which is an isometric schematic diagram of a first specific embodiment of the second gas distribution plate in FIG. 7, FIG. 9 which is a top view of the second gas distribution plate shown in FIG. 8, and FIG. 10 which is a partial enlarged drawing of a section B in FIG. 9.

In this specific embodiment, the second gas distribution plate 6 provided by the invention is substantially doughnut-shaped (i.e. round ring-shaped); and the inner diameter of the second gas distribution plate 6 is adapted to the outer diameter of the first gas distribution plate 4, and both the gas distribution plates are fixedly connected together in a conventional manner, e.g. by means of a stepped surface.

A surface of the second gas distribution plate 6 facing the support plate 3 is provided with at least one circumferential gas-flow groove 61 which surrounds the first gas distribution plate 4; in the specific embodiment, the second gas distribution plate 6 includes only one circumferential gas-flow groove 61. Specifically, the shape of the circumferential gas-flow groove 61 may be round, and when there are two or more circumferential gas-flow grooves 61, all the circumferential gas-flow grooves 61 are preferably concentrically arranged. The second air inlet passage 32 is preferably corresponding to the circumferential gas-flow groove 61, such that the process gas can successfully spread along the circumferential gas-flow groove 61 in the circumferential direction.

The surface of the second gas distribution plate 6 facing the support plate 3 is further provided with a plurality of radial gas-flow grooves 62, each of which is divided by the circumferential gas-flow grooves 61 into an inner segment 62a and an outer segment 62b.

Preferably, depths of all the radial gas-flow grooves 62 as well as the circumferential gas-flow grooves 61 are the same; a shape of a cross section of each of the radial gas-flow grooves 62 may be square, trapezoid, round, ellipsoid and so on, and in order to make it easy to manufacture, it is better to set it as a square shape.

Axial viahole 63, which penetrate through the second gas distribution plate 6, are distributed in the above-mentioned circumferential gas-flow grooves 61 and radial gas-flow groove 62. A shape of a cross section of the axial viahole 63 may be round, square, triangular and so on, and the axial viahole 63 may be a straight hole, a stepped hole, or an inclined hole; it is preferable to set it as a straight hole with a round-shaped cross section so as to facilitate the manufacturing.

The process gas can enter into the center part and the ring-shaped peripheral part of the chamber space below the support plate 3 respectively through the first air inlet passage 31 and the second air inlet passage 32, and the process gas can enter into the chamber space on top of the showerhead electrode 5 respectively through the first gas distribution plate 4 and the second gas distribution plate 6, and then enters into the reaction chamber of the plasma processing equipment through the gas holes uniformly distributed on the showerhead electrode.

Therefore, the amount of the process gas flowing through the first air inlet passage 31 and the second air inlet passage 32 can be respectively adjusted, so as to avoid that a difference between the density of the process gas in the center part and that in the ring-shaped peripheral part of the reaction chamber.

Some modifications can be made to the above described second gas distribution plate.

First of all, the width of the radial gas-flow groove 62 may be set to gradually increase from an inner side of the second gas distribution plate 6 to an outer side of the second gas distribution plate 6. As illustrated in FIG. 10, the width of the inner segment 62a and that of the outer segment 62b of the radial gas-flow groove 62 successively increase, and the width of each segment itself gradually reduces outwards.

Space of the reaction chamber below the outer side of the second gas distribution plate 6 is big, thus more process gas is required; while the space of the reaction chamber below the inner side of the second gas distribution plate 6 is relatively small, thus less process gas is required. After the process gas enters into the circumferential gas-flow groove 61 via the second air inlet passage 32, a larger part of the process gas will flow to the outer side along the wider outer segment 62b of the radial gas-flow groove 62, and a smaller part of the process gas will flow to the inner side along the narrower inner segment 62a of the radial gas-flow groove 62; thus, the uniformity of the process gas distribution will be enhanced.

Secondly, minimal cross-section areas of the axial viahole 63 can be adjusted, such that the minimal cross-section area of the axial viahole 63 in the inner segment 62a and that in the outer segment 62b of the radial gas-flow groove 62 increase successively; that's to say, the minimal cross-section area of the axial viahole 63a and the minimal cross-section area of the axial viahole 63b increase successively.

As the minimal cross-section area increases, the gas passing ability of the axial viahole 63 is enhanced; thus, the ability of gas supply at the outer side of the second gas distribution plate 6 will be enhanced, then the peripheral portion of the reaction chamber is free from lacking of gas.

Thirdly, density of the axial viahole 63 can be adjusted, such that the density of the axial viahole 63 at the peripheral portion of the second gas distribution plate 6 is bigger; that is, the density of the axial viahole 63a in the inner segment 62a of the radial gas-flow groove 62 is smaller than the density of the axial viahole 63b in the outer segment 62b of the radial gas-flow groove 62. A purpose for such arrangement is also to increase the gas supply at the peripheral portion of the reaction chamber, and in turn to avoid lacking of gas.

Figure 11:
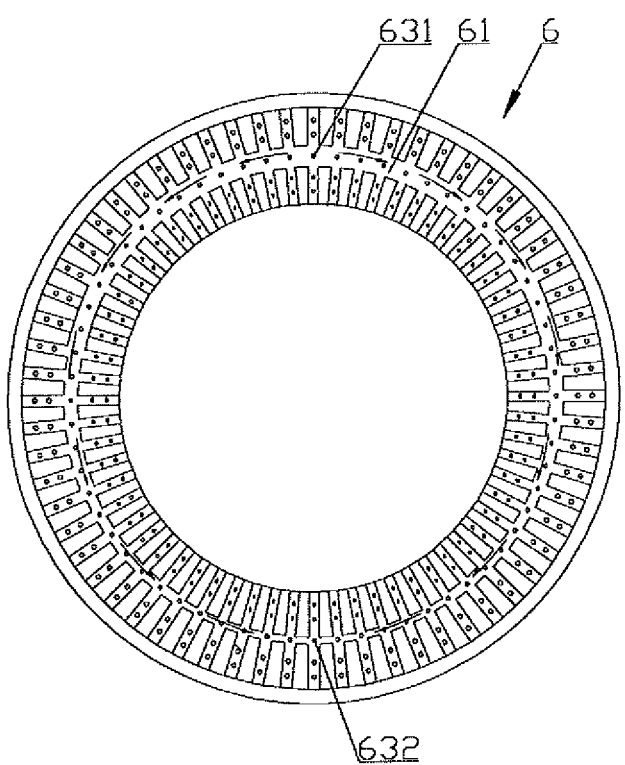
FIG. 11 is a top view of a second specific embodiment of the second gas distribution plate in FIG. 7.

Reference could be made to FIG. 11 which is a top view of a second specific embodiment of the second gas distribution plate in FIG. 7.

In the second specific embodiment, the second gas distribution plate provided by the invention is modified on the basis of the above described first embodiment; and modifications are focus on shape of the circumferential gas-flow groove 61 corresponding to the second air inlet passage 32.

The position of the axial viahole 631 in FIG. 11 corresponds to the second air inlet passage 32, thus, the process gas entered from the second air inlet passage 32 first arrives at the position of the axial viahole 631, and then is divided into two branches to spread towards both sides along the directions indicated by arrows in the figure; eventually, the two branches of the process gas converge at the position of the axial viahole 632. Obviously, the position of the axial viahole 631 and the position of the axial viahole 632 are substantially symmetric.

The width of the circumferential gas-flow grooves 61 can be set to gradually reduce along the direction of gas flow (i.e. the direction indicated by the arrows in FIG. 11). As the process gas spreads from the circumferential gas-flow groove 61 to the radial gas-flow grooves 62 at both sides of the circumferential gas-flow grooves 61, the amount of the process gas continuously reduce along the direction indicated by the arrows in figure; however, because the width of the circumferential gas-flow grooves 61 gradually reduce, flow of the process gas won't speed down obviously, that means that ability of the process gas to spread towards the axial viahole 632 won't reduce apparently; in this way, the uniformity of the process gas distribution is further guaranteed.

The plasma processing equipment provided by the invention comprises the gas distribution apparatus described in the above. Specifically, said plasma processing equipment may be a plasma etching equipment or a plasma deposition equipment.

The gas distribution apparatus provided by the invention and the plasma processing equipment using said gas distribution apparatus are specifically described in the above. The principle of the invention and its implementations are expatiated with respect to detailed examples, however, the specific embodiments are used to help us to understand the method of the invention as well as its key concept. The modifications and variations to the invention that may be obtained by one skilled in the art without departing from the scope of the present invention are intended to be included within the scope as defined in accompanying claims of the present invention.

The invention claimed is:

1. A gas distribution apparatus used for a plasma processing equipment, comprising a horizontally arranged support plate which is fixedly connected to a top electrode of the plasma processing equipment, a first air inlet passage is provided at a central position of the support plate; a showerhead electrode, which is parallel to the support plate, is fixedly connected below the support plate, a first gas distribution plate is horizontally arranged in a chamber between the support plate and the showerhead electrode, and the first gas distribution plate has a plurality of axial viahole; a central position of the first gas distribution plate is corresponding to the central position of the support plate;

wherein a plurality of circumferential gas-flow grooves surrounding the central position of the first gas distribution plate and a plurality of radial gas-flow grooves communicating with the plurality of circumferential gas-flow grooves, are arranged on an upper surface of the gas distribution plate; the plurality of axial viahole are arranged in a plurality of the at least one circumferential gas-flow grooves and the plurality of radial gas-flow grooves; the plurality of radial gas-flow grooves being uniformly distributed, and a width of a respective one of the plurality of radial gas-flow grooves being gradually reduced outwards along a radial direction of the first gas distribution plate; and a width of a respective one of the plurality of circumferential gas-flow grooves successively increasing outwards along the radial direction of the first gas distribution plate.

2. The gas distribution apparatus as claimed in claim 1, characterized in that, minimal cross-section areas of all the axial viahole in one and the same circumferential gas-flow groove are the same; minimal cross-section area of each axial viahole in one and the same radial gas-flow groove gradually increases outwards along the radial direction of the first gas distribution plate.

3. The plasma processing equipment of claim 2, characterized in that the plasma processing equipment comprises the gas distribution apparatus.

4. The gas distribution apparatus as claimed in claim 2, characterized in that, density of the axial viahole in one and the same radial gas-flow groove gradually increases outwards along the radial direction of the first gas distribution plate.

5. The plasma processing equipment of claim 4, characterized in that the plasma processing equipment comprises the gas distribution apparatus.

6. The gas distribution apparatus as claimed in claim 1, characterized in that, the support plate further comprises a second air inlet passage which is deviated from the central position of the support plate, a distance between the second air inlet passage and the first air inlet passage is larger than a radius of the first gas distribution plate; and a second gas distribution plate is further included in the chamber between the support plate and the showerhead electrode, and the second gas distribution plate closely surrounds the first gas distribution plate, and chamber on top of the first gas distribution plate is separated from that on top of the second gas distribution plate by a sealing ring, the second gas distribution plate includes at least one circumferential gas-flow groove and a plurality of radial gas-flow grooves communicating with the at least one circumferential gas-flow groove; a plurality of axial viahole are arranged in the at least one circumferential gas-flow groove and the plurality of radial gas-flow grooves.

7. The gas distribution apparatus as claimed in claim 6, characterized in that, the second air inlet passage is corresponding to one circumferential gas-flow groove of the second gas distribution plate.

8. The gas distribution apparatus as claimed in claim 7, characterized in that, width of the one circumferential gas-flow groove which is corresponding to the second air inlet passage gradually reduces in the direction of gas flow.

9. The gas distribution apparatus as claimed in claim 8, characterized in that, widths of the radial gas-flow grooves in the second gas distribution plate gradually increase outwards along a radial direction of the second gas distribution plate.

10. The gas distribution apparatus as claimed in claim 9, characterized in that, minimal cross-section areas of respective axial viahole located in one and the same circumferential gas-flow groove in the second gas distribution plate successively increase outwards along the radial direction of the second gas distribution plate.

11. The gas distribution apparatus as claimed in claim 10, characterized in that, density of axial viahole located in one and the same circumferential gas-flow groove in the second gas distribution plate successively increase outwards along the radial direction of the second gas distribution plate.

12. The gas distribution apparatus as claimed in claim 11, characterized in that, the second gas distribution plate comprises a plurality of circumferential gas-flow grooves, widths of the plurality of circumferential gas-flow grooves successively increase outwards along the radial direction of the second gas distribution plate.

13. A plasma processing equipment, characterized in that the plasma processing equipment comprises the gas distribution apparatus as claimed in claim 1.

14. The plasma processing equipment as claimed in claim 13, characterized in that the plasma processing equipment is a plasma etching equipment or a plasma deposition equipment.

\* \* \* \* \*